US006493282B2

(12) United States Patent
Iida et al.

(10) Patent No.: US 6,493,282 B2
(45) Date of Patent: Dec. 10, 2002

(54) SEMICONDUCTOR INTEGRATED CIRCUIT

(75) Inventors: Masahisa Iida, Osaka (JP); Kiyoto Oota, Osaka (JP); Yuji Yamasaki, Osaka (JP); Hakuhei Kawakami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/946,480

(22) Filed: Sep. 6, 2001

(65) Prior Publication Data

US 2002/0027810 A1 Mar. 7, 2002

(30) Foreign Application Priority Data

Sep. 6, 2000 (JP) ........................................ 2000-270579

(51) Int. Cl.[7] ................................................. G11C 7/00
(52) U.S. Cl. ................... 365/226; 365/189.09; 365/203
(58) Field of Search ....................... 365/189.09, 189.11, 365/226, 225.7

(56) References Cited

U.S. PATENT DOCUMENTS

| 5,198,995 A | 3/1993 | Dennard et al. | ............ 365/149 |
|---|---|---|---|
| 5,251,172 A | 10/1993 | Yamauchi | ............... 365/189.09 |
| 5,826,611 A | * 10/1998 | Kaneko et al. | ............. 365/226 |
| 5,999,440 A | * 12/1999 | Crafts | ........................ 365/226 |
| 6,009,023 A | * 12/1999 | Lu et al. | ..................... 365/226 |
| 6,075,720 A | 6/2000 | Leung et al. | ................ 365/149 |
| 6,163,493 A | * 12/2000 | Yamagata et al. | .......... 365/226 |
| 6,335,893 B1 | * 1/2002 | Tanaka et al. | .............. 365/226 |

* cited by examiner

*Primary Examiner*—Trong Phan
(74) *Attorney, Agent, or Firm*—McDermott, Will & Emery

(57) ABSTRACT

A semiconductor integrated circuit includes: a first n-well defined in a p-type semiconductor region; word lines; data lines; and a DRAM array. In the array, memory cells are arranged in matrix over the first n-well. Each memory cell includes a p-channel MOS access transistor and a capacitor. The access transistor has its gate connected to an associated one of the word lines, its source connected to an associated one of the data lines and its drain connected to the capacitor. The integrated circuit further includes: a row of sense amplifiers coupled to the data lines; a word line driver for driving the word lines; and a power supply circuit. The power supply circuit receives an external supply voltage, generates internal supply voltages by stepping down the external supply voltage and then applies the internal supply voltages to the sense amplifiers, word line driver and first n-well.

19 Claims, 10 Drawing Sheets

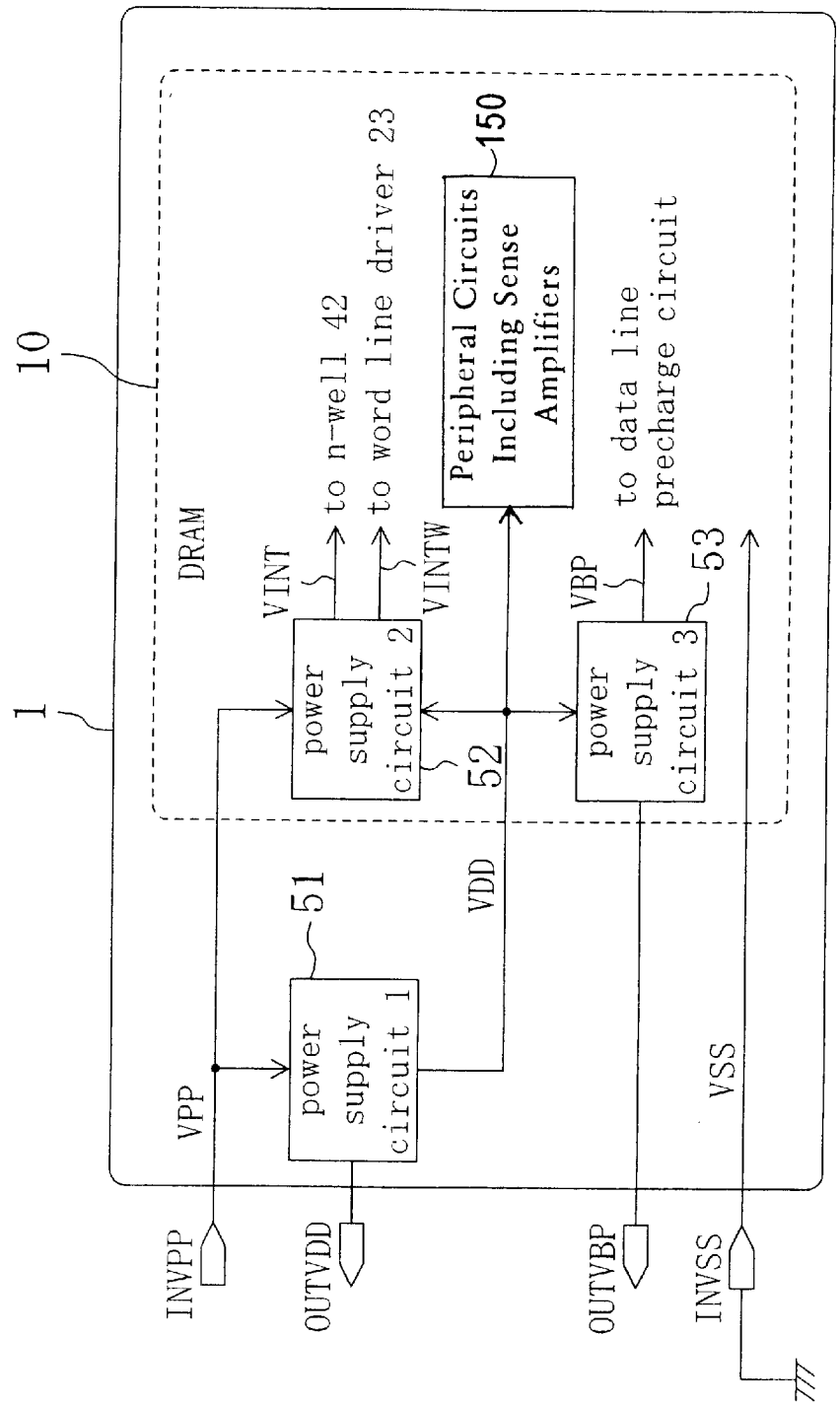

SEMICONDUCTOR INTEGRATED CIRCUIT

BACKGROUND OF THE INVENTION

The present invention relates to a semiconductor integrated circuit with a dynamic random-access memory (DRAM).

Recently, an LSI, in which a logic circuit, like a central processing unit (CPU) or application-specific integrated circuit (ASIC), and a DRAM have been integrated together on a single semiconductor substrate, has been the object of much attention. In the following description, a semiconductor integrated circuit of this type will be referred to as a "DRAM-built-in LSI", which is also called an "LSI with an embedded DRAM". A DRAM-built-in LSI is attractive, because an LSI of this type realizes various functions, which have had to be executed using multiple chips including logic and general-purpose DRAM chips, by a single chip.

For a DRAM-built-in LSI, there is no need to interconnect multiple chips together by way of long wires. In addition, the same bonding pad can be used for both the logic and memory circuits alike. Accordingly, the LSI occupies a smaller area when mounted on a circuit board. Furthermore, the shorter wire length contributes to decreasing the wiring capacitance and increasing the data transfer rate. Moreover, no drivers of a great size are needed anymore because those long wires can be eliminated. As a result, the power dissipation of the overall system can be reduced advantageously.

Hereinafter, a typical known DRAM-built-in LSI, including a stacked capacitor DRAM, will be described. In the LSI of this type, its logic circuit is implemented as a complementary metal-oxide semiconductor (CMOS) circuit.

FIG. 8 is a cross-sectional view schematically illustrating a structure for a known DRAM-built-in LSI including a stacked capacitor DRAM. The LSI shown in FIG. 8 includes p-type semiconductor substrate (p-SUB) 91, n-wells (NWs) 92 and 94, p-well (PW) 93, n-channel MOS (NMOS) memory access transistor 95, stacked memory cell capacitor 96 and NMOS and p-channel MOS (PMOS) transistors 97 and 98 for a logic circuit.

As shown in FIG. 8, the NWs 92 and 94 and the PW 93 have been defined in the p-SUB 91. Multiple $n^+$- and $p^+$-type doped regions have also been defined in the p-SUB 91. The NMOS memory access transistor 95 is connected to a data line BL and a word line WL. A supply voltage VDD is applied to the NWS 92 and 94, while a substrate bias voltage VBB, lower than the ground voltage, is applied to the PW 93.

In a DRAM-built-in LSI in general, the transistors and capacitors thereof are downsized to increase the operating speed of its logic circuit, and the transistors are integrated together highly densely in its DRAM to reduce the necessary chip area. As shown in FIG. 8, an NMOS transistor is used as the memory access transistor 95. On the other hand, the memory cell capacitor 96 has a three-dimensional structure (e.g., implemented as a stacked type) to produce a capacitance large enough to stabilize the operation of the DRAM. Furthermore, the PW 93 is included in the NW 92 that has been defined in the p-SUB 91, thus forming a so-called "triple well structure".

The PW 93, NW 92 and p-SUB 91 are supplied with such voltages that will make their pn junctions reverse biased.

Specifically, the p-SUB 91, NW 92 and PW 93 are biased to the ground voltage, the supply voltage VDD and a negative voltage VBB, which is lower than the ground voltage, respectively. The voltages VDD and VBB are output from a power supply circuit (not shown) formed on the p-SUB 91.

By forming the memory access transistor 95 and memory cell capacitor 96 over the triple well structure and by biasing those wells to these levels, the memory and logic circuits can be electrically isolated from each other. In addition, the threshold voltage of the memory access transistor 95 is set high enough so that the charges stored on the memory cell capacitor 96 do not leak into the data line BL by way of the memory access transistor 95.

The voltage on the data line BL will be somewhere between the ground voltage and the supply voltage VDD. To read or write data from/on the memory cell capacitor 96, a voltage higher than the supply voltage VDD by the threshold voltage of the memory access transistor 95 should be applied to the gate electrode of the transistor 95. Accordingly, either a voltage generated by an internal booster or an externally in-put voltage should be applied onto the word line WL.

In the logic circuit section on the other hand, the NMOS and PMOS transistors 97 and 98, existing over the p-SUB 91 and NW 94, respectively, form part of a CMOS logic circuit. In the CMOS logic circuit, the NMOS and PMOS transistors 97 and 98 operate mutually complementarily. Since the p-SUB 91 is biased to the ground voltage, the threshold voltage does not increase or the operating speed does not decrease.

A DRAM-built-in LSI of this type, however, requires a fabrication process much more complicated than a normal CMOS process. Also, a greater number of process steps or masks are needed, thus raising the fabrication costs disadvantageously. For example, the process steps of forming the triple well structure and forming the stacked memory cell capacitor should be carried out in addition to those of a normal CMOS process.

Moreover, where the stacked capacitor is formed over the data line, the upper electrode thereof should be located at a rather high level, thus increasing the aspect ratio of a via that connects the first- and second-level interconnects together. Accordingly, it is much more difficult to form such an interconnect structure. Furthermore, after the transistors have been formed for the CMOS logic circuit, a capacitive insulating film should be formed at an elevated temperature for the stacked capacitor. Thus, the transistors of the CMOS logic circuit might have their performance degraded.

Furthermore, a charge-pump-type voltage step-up power supply circuit should be provided to apply the voltage, higher than the supply voltage VDD, as a word line drive voltage. A charge-pump-type negative voltage power supply circuit should also be provided to bias the well, on which the memory cell will be formed, to the voltage lower than the ground voltage. These charge-pump-type power supply circuits, however, often cause a great, inconstant variation in the voltage supplied. This is a problem inevitable for the power supply circuits of this type due to their constructions. Accordingly, not so great a margin is allowable for the voltage or temperature range in which the DRAM can operate stably enough.

Considering the compatibility with the CMOS process, it would be more advantageous to integrate a static random-access memory (SRAM), not the DRAM, with the CMOS logic circuit on the same semiconductor substrate. However, a normal six-transistor SRAM cell is greater in area than a DRAM cell almost tenfold. Accordingly, the SRAM would require a much greater chip area. Consequently, even in compliance with the currently minimum possible design rule of 0.18 μm, for example, the SRAM built in the chip can have a storage capacity of just several hundreds kilobits at most.

In contrast, a DRAM cell is much smaller in area than an SRAM cell. Thus, a great number of DRAM cells can be integrated together on a single chip. That is to say, a CMOS logic circuit and a DRAM with a large storage capacity can be integrated together on a small-area chip. However, the known DRAM-built-in LSI requires a much higher process cost and likely results in performance degradation of the CMOS logic circuit thereof as described above. Accordingly, the effective applications of the known DRAM-built-in LSI are virtually limited to transferring an enormous quantity of data at a high speed by using a DRAM that has a rather great storage capacity and a bus of a broad enough bit width (e.g., graphics applications).

On the other hand, there are many applications requiring a memory with a storage capacity of about 1 to 4 megabits, which may be regarded as a "medium capacity" in accordance with the minimum design rule of 0.18 μm. Accordingly, demand for integrating a medium-capacity memory, which needs a much smaller chip area than an SRAM with a similar capacity, along with a high-performance logic circuit on the same chip at a low cost has been on the rise.

SUMMARY OF THE INVENTION

It is therefore an object of the present invention to provide a semiconductor integrated circuit, including a stably operating DRAM, at a low cost.

Specifically, an inventive semiconductor integrated circuit includes: a first n-well defined in a p-type semiconductor region; word lines; data lines; and a dynamic randomaccess memory (DRAM) array. In the DRAM array, multiple memory cells are arranged in matrix over the first n-well. Each said memory cell includes a p-channel metal-oxide semiconductor (MOS) access transistor and a capacitor. The access transistor has its gate connected to an associated one of the word lines, its source connected to an associated one of the data lines and its drain connected to the capacitor. The integrated circuit further includes: a row of sense amplifiers coupled to the data lines; a word line driver for driving the word lines; and a power supply circuit. The power supply circuit receives an external supply voltage, generates internal supply voltages by stepping down the external supply voltage and then applies the internal supply voltages to the sense amplifiers, the word line driver and the first n-well.

In the inventive integrated circuit, the power supply circuit steps down the external supply voltage. Accordingly, there is no need to use any charge pump circuit that cannot operate stably enough due to its own circuit configuration. Instead, a voltage, generated by a voltage step-down circuit that realizes high-speed response and can supply a large current at a time, can be applied as an internal supply voltage to the sense amplifiers, for example. Thus, the memory array can operate stably enough.

In one embodiment of the present invention, the integrated circuit preferably further includes a logic circuit that has been formed in the p-type semiconductor region.

In such an embodiment, memory and logic circuits are formed on the same semiconductor substrate. Thus, the overall circuit area can be reduced and data can be transferred from the memory circuit to the logic circuit, or vice versa, at an increased rate.

In another embodiment of the present invention, the power supply circuit may step down the external supply voltage to generate primary and secondary internal supply voltages as the internal supply voltages. The primary internal supply voltage may be lower than the external supply voltage, while the secondary internal supply voltage may be lower than the external supply voltage but higher than the primary internal supply voltage. The primary internal supply voltage may be applied to the sense amplifiers, while the first n-well may be biased to the secondary internal supply voltage.

Then, the substrate can be biased in such a manner that the access transistor of each memory cell can have its threshold voltage raised and that the charges stored on the capacitor of the memory cell will not leak into the data line by way of the access transistor. In addition, the junction capacitance also decreases, so it is possible to reduce the parasitic capacitance associated with the data line. Accordingly, even if just a small quantity of charges have been stored on the capacitor of a memory cell, the memory cell still can be read accurately. That is to say, a broader margin is allowable for the operation range of the memory.

In this particular embodiment, the integrated circuit preferably further includes: a second n-well defined in the p-type semiconductor region; and a logic circuit. The logic circuit preferably includes: an n-channel MOS transistor formed in the p-type semiconductor region; and a p-channel MOS transistor formed in the second n-well. The power supply circuit preferably biases the second n-well to the primary internal supply voltage.

Then, memory array and CMOS logic circuit can be formed on the same semiconductor substrate without using the triple well structure. As a result, the fabrication process can be simplified.

Specifically, the capacitor of each said memory cell preferably includes: a planar insulating film formed over the first n-well; and a planar upper electrode formed over the planar insulating film and biased to a ground voltage.

Then, the memory cell can be made without performing any complicated process for forming a stacked or trenched capacitor. In addition, a capacitive insulating film for the capacitor of each memory cell can be made of an insulator with a dielectric constant higher than that of silicon dioxide. Accordingly, the capacitance per unit area can be increased for the capacitor, so the memory cell including that capacitor may have a smaller area. As a result, the fabrication cost can be cut down.

More specifically, the planar insulating film is preferably a silicon dioxide film that is almost as thick as the gate oxide film of the n- and p-channel MOS transistors.

In such an embodiment, the gate oxide film of transistors for a CMOS logic circuit and the capacitive insulating film of capacitors for memory cells can be formed in a single process step. Accordingly, a CMOS logic circuit and a DRAM array can be. formed on the same semiconductor substrate through a completely standard CMOS process, thus cutting down the fabrication cost. In addition, while the DRAM array is being formed for a semiconductor integrated circuit, the CMOS logic circuit does not have its performance degraded.

In still another embodiment, the power supply circuit may include a first MOS transistor and a first differential amplifier. The first MOS transistor may be interposed between an external supply voltage terminal and a first output terminal. The external supply voltage is applied through the external supply voltage terminal. The first differential amplifier may receive a first reference voltage and a voltage at the first output terminal. The power supply circuit may control the first MOS transistor by the output of the first differential amplifier. Also, the power supply circuit may set the primary internal supply voltage at a substantially constant voltage in accordance with the first reference voltage and output the primary internal supply voltage through the first output terminal.

Then, the power supply circuit can apply a constant primary internal supply voltage, which does not change depending on the external supply voltage, to various peripheral circuits (e.g., sense amplifiers) of the memory array. Thus, the memory can operate stably enough with a broader operation margin allowed against a variation in the external supply voltage.

In this particular embodiment, the power supply circuit preferably further includes a first reference voltage generator for generating the first reference voltage. The first reference voltage generator preferably includes a first fuse and regulates the first reference voltage by trimming the first fuse.

Then, the output voltage of the power supply circuit is regulable by trimming the fuse when the memory is tested after the integrated circuit has been fabricated. Thus, a constant voltage can be output without being affected by any process-related variation. That is to say, the memory can operate stably enough with a great margin allowed against the process-related variations. In addition, it is also possible to optimize the output voltage of the power supply circuit and stabilize the memory operation according to how much the characteristic value of the transistors has changed with the process-related variations.

Alternatively, the power supply circuit may further include a second MOS transistor and a second differential amplifier. The second MOS transistor may be interposed between the external supply voltage terminal and a second output terminal. The second differential amplifier may receive a second reference voltage and a voltage at the second output terminal. The power supply circuit may control the second MOS transistor by the output of the second differential amplifier. Also, the power supply circuit may set the secondary internal supply voltage at a substantially constant voltage corresponding to the second reference voltage and output the secondary internal supply voltage through the second output terminal.

Then, the power supply circuit can output a constant secondary internal supply voltage that does not change depending on the external supply voltage. Generally speaking, a voltage step-down circuit has higher current supplying ability and higher response speed than a voltage step-up circuit. Accordingly, if the first n-well is biased to this secondary internal supply voltage, a variation in voltage at the first n-well, resulting from a substrate current produced during the memory operation, can be minimized. As a result, the memory array can operate stably enough.

Specifically, in this case, the power supply circuit preferably generates the second reference voltage based on the primary internal supply voltage.

optionally, the power supply circuit may further include a second reference voltage generator for generating the second reference voltage. The second reference voltage generator may include a second fuse and regulate the second reference voltage by trimming the second fuse.

In yet another embodiment, the power supply circuit may step down the external supply voltage to generate primary and secondary internal supply voltages as the internal supply voltages. The primary internal supply voltage may be lower than the external supply voltage, while the secondary internal supply voltage may be lower than the external supply voltage but higher than the primary internal supply voltage. The primary internal supply voltage may be applied to the sense amplifiers, while the secondary internal supply voltage may be applied to the word line driver. The sense amplifiers may supply the primary internal supply voltage as a high-level voltage to the data lines. The word line driver may supply the secondary internal supply voltage as a non-selected-state voltage to the word lines.

In such an embodiment, when a memory cell is non-selected to store charges thereon, the access transistor of the memory cell has its gate voltage raised. Then, the sub-threshold current can be reduced drastically and the leakage of the charges from the capacitor into the data line by way of the access transistor can be minimized. That is to say, the charge retainability of the capacitor improves. Also, when the secondary internal supply voltage is set at a substantially constant value, the variation in sub-threshold current, resulting from the change in gate voltage of the access transistor of the memory cell, can be minimized. Accordingly, the capacitor can retain stored charges thereon almost completely even against the variation in external supply voltage.

In yet another embodiment, the power supply circuit may step down the external supply voltage to generate primary and secondary internal supply voltages as the internal supply voltages. The primary internal supply voltage may be lower than the external supply voltage. The secondary internal supply voltage may be approximately equal to an average of the absolute value of a threshold voltage of the access transistor and the primary internal supply voltage. The data lines may be supplied with the secondary internal supply voltage as a precharge voltage. And the word lines may be supplied with a ground voltage as a selected-state voltage.

In such an embodiment, a voltage, approximately equal to an average of the high- and low-level voltages on the data lines, is the precharge voltage for the data lines. This voltage is almost equal to an average of the capacitor voltage of a memory cell on which charges are stored and the capacitor voltage of the same memory cell on which no charges are stored. Accordingly, the variation in voltage on the data lines when stored charges are read out from a capacitor onto the data lines can have almost the same absolute value as the variation in voltage on the data lines when no charges are read out from the capacitor. For that reason, the read data can have its logical level determined accurately enough by the variation in voltage on the data lines with the read error minimized.

In this particular embodiment, a voltage representing the low level of the data lines is preferably the ground voltage.

BRIEF DESCRIPTION OF THE DRAWINGS

FIG. 5 is a block diagram illustrating how power supply circuits are connected for the semiconductor integrated circuit shown in FIG. 1.

DESCRIPTION OF THE PREFERRED EMBODIMENTS

Hereinafter, preferred embodiments of the present invention will be described with reference to the accompanying drawings. It should be noted that each and every voltage will be herein determined by reference to the ground potential.

Figure 1:
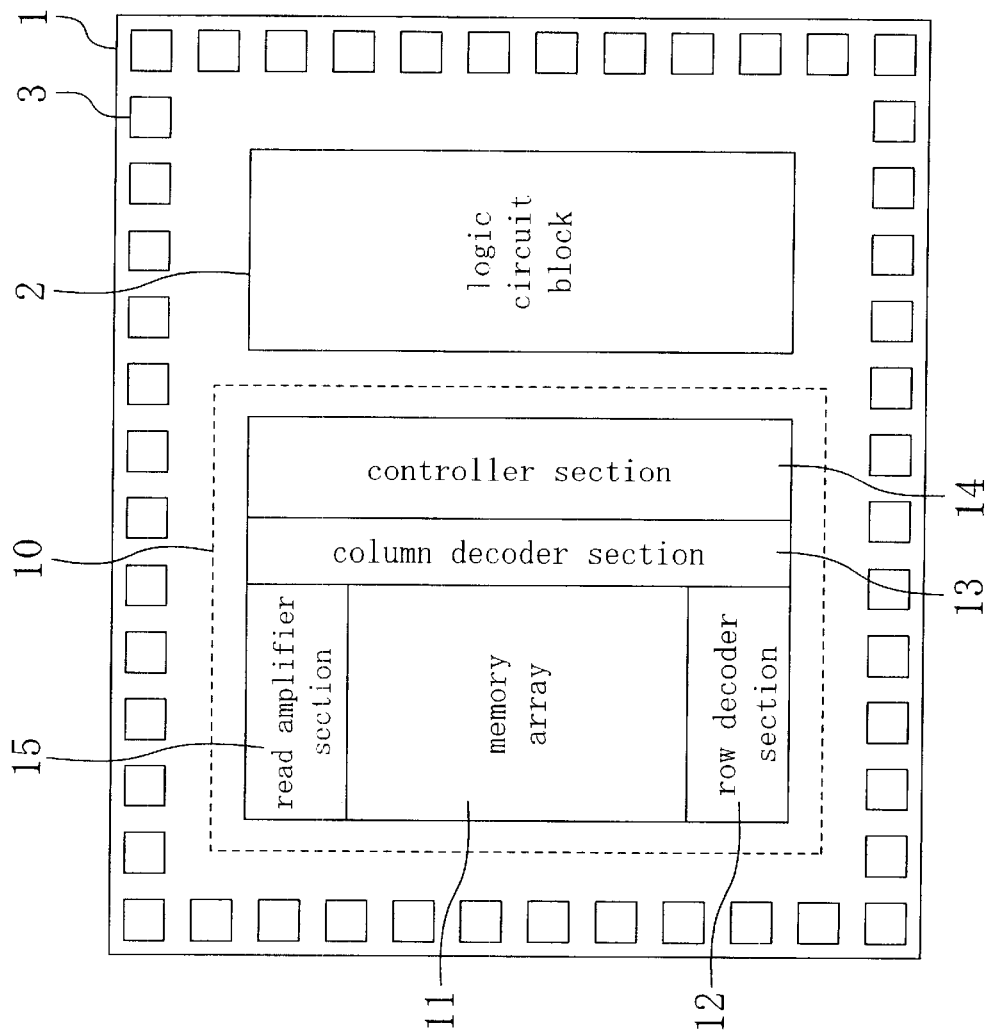
FIG. 1 schematically illustrates an exemplary arrangement of circuit blocks for a semiconductor integrated circuit according to an embodiment of the present invention.

FIG. 1 schematically illustrates an exemplary arrangement of circuit blocks for a semiconductor integrated circuit according to an embodiment of the present invention. The integrated circuit 1 shown in FIG. 1 includes a CMOS logic circuit block 2 and a DRAM block 10 on the same semiconductor substrate. In the CMOS logic circuit block 2, various logic circuits, which have no direct association with the DRAM, have been formed.

The DRAM block 10 includes memory array 11, row decoder section 12, column decoder section 13, memory controller section 14 and read amplifier section 15. The row decoder section 12 includes row decoder and word line driver. The column decoder section 13 includes column decoder, selector and sense amplifier row. The read amplifier section 15 includes read amplifier and write amplifier. The integrated circuit 1 further includes a plurality of pads 3, to which input/output signal lines extending from various external units are connected, along the periphery of the substrate.

Figure 2:
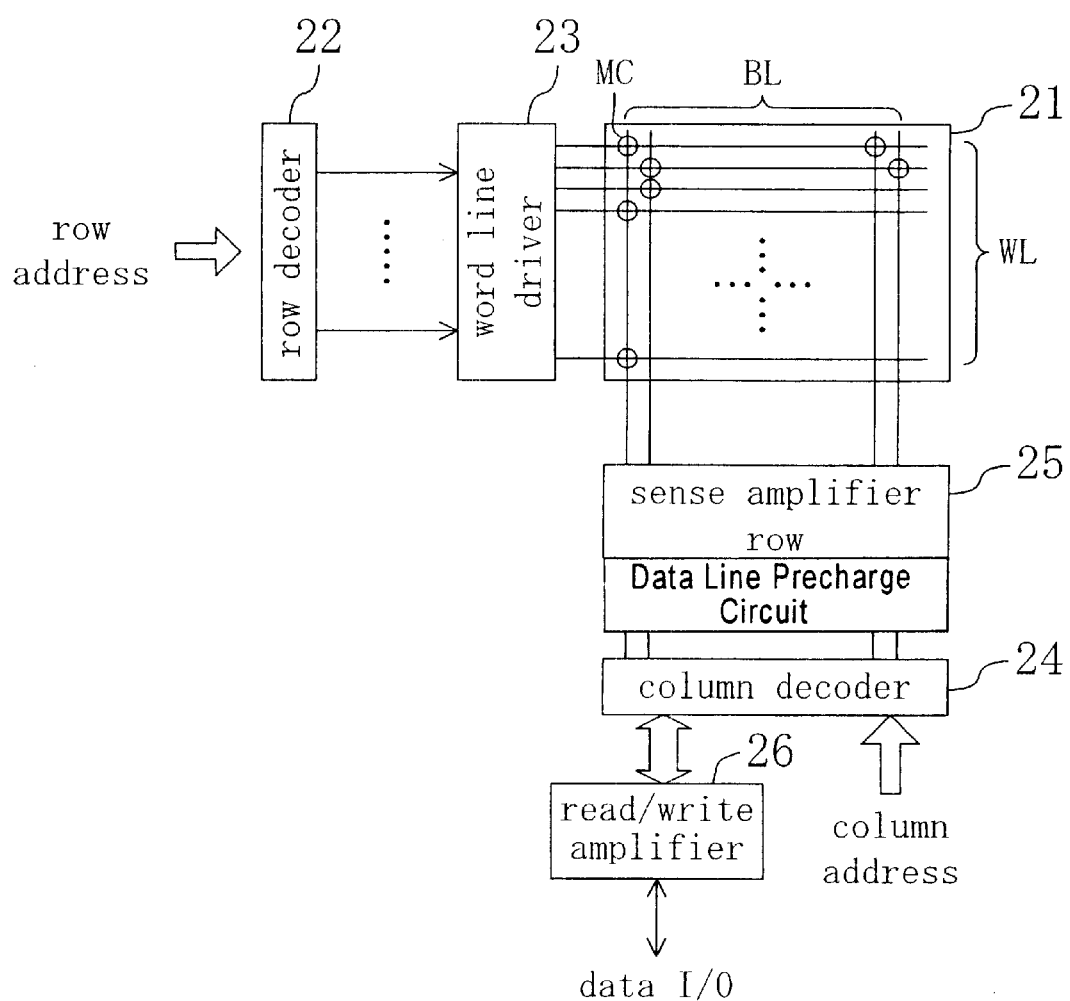
FIG. 2 is a block diagram illustrating a configuration for the DRAM block shown in FIG. 1.

FIG. 2 is a block diagram illustrating a configuration for the DRAM block 10 shown in FIG. 1. As shown in FIG. 2, the DRAM block 10 includes DRAM array 21 (corresponding to the memory array shown in FIG. 1), row decoder 22, word line driver 23, column decoder 24, row of sense amplifiers (which will be herein called a "sense amplifier row 25") and read/write amplifier 26. The DRAM array 21 includes. multiple memory cells MC arranged in matrix (i.e., in columns and rows), a plurality of word lines WL and a plurality of data lines BL. Each of the word lines WL is connected to the select terminals of the memory cells MC belonging to the associated one of the rows. Each of the data lines BL is connected to the data input/output terminals of the memory cells MC belonging to the associated one of the columns. The data lines BL have a folded data line structure.

As shown in FIG. 2, a row address is input to the row decoder 22. In response, the row decoder 22 selects one of the word lines WL that has been specified by the row address, and gets the selected word line WL activated by the word line driver 23. A column address is input to the column decoder 24. The column decoder 24 exchanges data with the sense amplifier row 25, which are connected to the data lines BL, and the read/write amplifier 26. Specifically, the column decoder 24 gets desired data read or written by the read/write amplifier through one of the data lines BL that has been specified by the column address. The read/write amplifier 26 inputs and outputs data by way of a data I/O line.

In the illustrated embodiment, the column decoder 24 includes a selector. The sense amplifier row 25 includes: a plurality of CMOS cross-coupled differential amplifiers, which are associated with respective complementary data lines for the folded data lines, as sense amplifiers; a data line precharge circuit; an equalizer circuit; and a column switch circuit.

Figure 3:
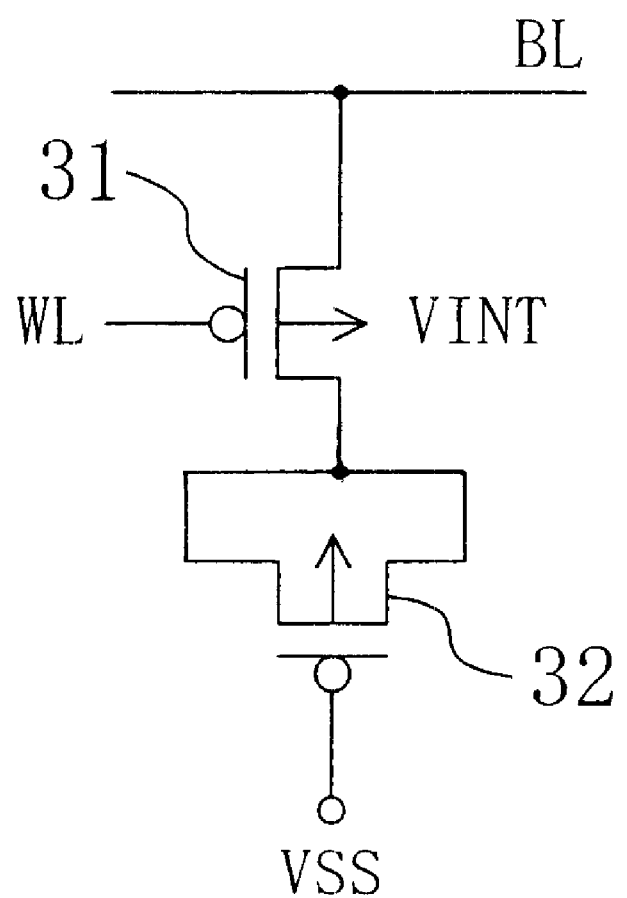
FIG. 3 is a circuit diagram illustrating a memory cell included in the memory array shown in FIG. 2.

FIG. 3 is a circuit diagram illustrating a configuration for each of the memory cells MC included in the memory array 21 shown in FIG. 2. As shown in FIG. 3, the memory cell MC includes: a memory access transistor 31 implemented as a PMOS transistor; and a capacitor 32. The memory access transistor 31 has its source or drain connected to the associated data line BL, its drain or source connected to one of the two terminals of the capacitor 32 and its gate connected to the associated word line WL. A ground voltage VSS is applied to the other terminal of the capacitor 32.

Figure 4:
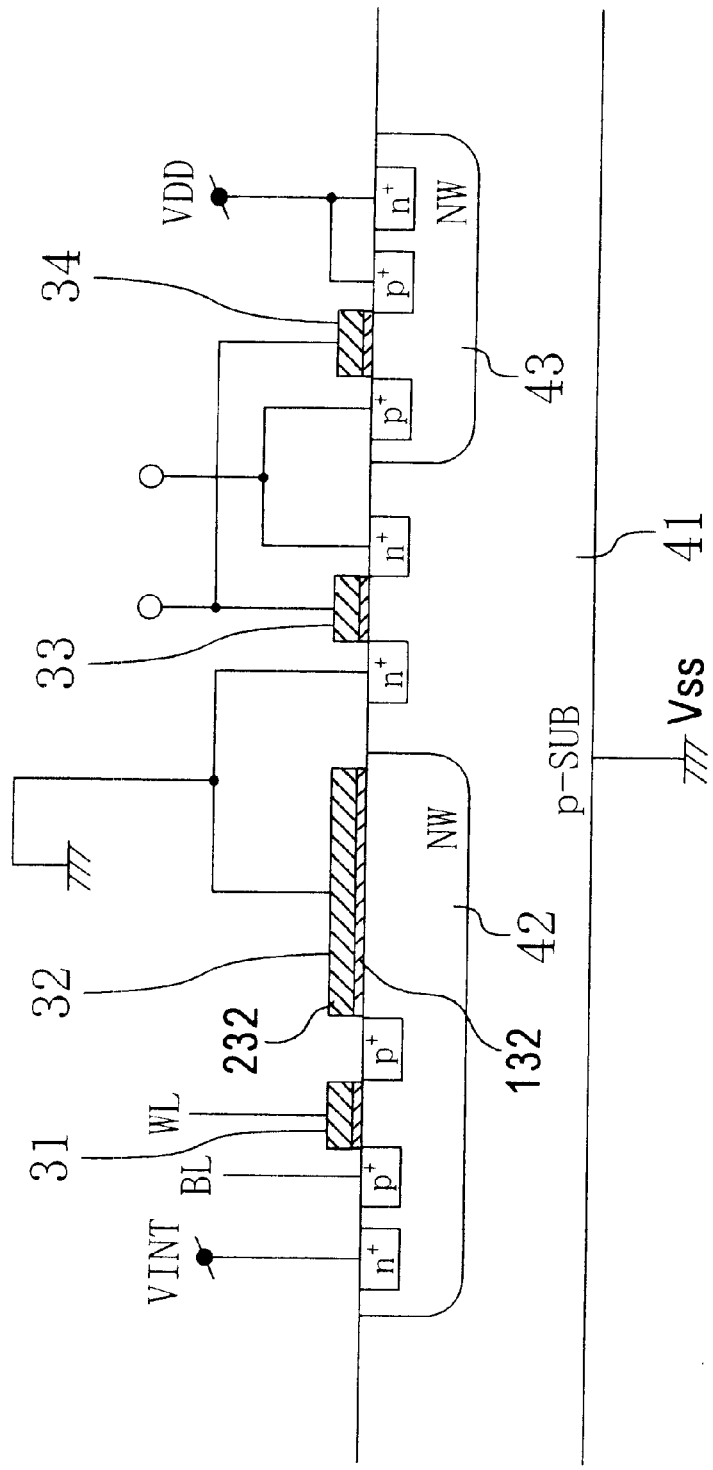
FIG. 4 is a cross-sectional view schematically illustrating a structure for the semiconductor integrated circuit shown in FIG. 1.

FIG. 4 is a cross-sectional view schematically illustrating a structure for the semiconductor integrated circuit 1 shown in FIG. 1. As shown in FIG. 4, first and second n-wells 42 and 43 have been defined in a p-type semiconductor substrate 41. Although just a part thereof is shown in FIG. 4, the memory array 21 exists over the first n-well 42.

The p-type semiconductor substrate 41 is biased to the ground voltage VSS. The second n-well 43 is biased to a first internal supply voltage (which is equivalent to the primary internal supply voltage as defined in the claims) VDD, which is lower than a supply voltage VPP that has been externally applied to the integrated circuit shown in FIG. 1. On the other hand, the first n-well 42 is biased to a second internal supply voltage (which is equivalent to the secondary internal supply voltage as defined in the claims) VINT, which is lower than the external supply voltage VPP but higher than the first internal supply voltage VDD. Accordingly, the pn junction formed between the first n-well 42 and p-type substrate 41 and the pn junction formed between the second n-well 43 and p-type substrate 41 are both reverse biased.

On the first n-well 42, the PMOS transistor 31 as the memory access transistor and the capacitor 32 have been formed. That is t o say, the capacitor 32 is made up of: the first n-well 42 serving as an electrically conductive layer; a planar silicon dioxide film 132 deposited on the conductive layer; and a planar upper electrode 232 formed on the silicon dioxide film. The upper electrode is biased to the ground voltage VSS. The memory access transistor 31 and the capacitor 32 together makes one memory cell MC for the memory array 21.

On the other hand, NMOS and PMOS transistors 33 and 34, which have been formed over the p-type substrate 41 and the second n-well 43, respectively, operate mutually complementarily as a CMOS logic circuit, which forms part of the CMOS logic circuit block 2 shown in FIG. 1.

In the embodiment illustrated in FIG. 4, only one memory access transistor 31, one capacitor 32, one NMOS transistor 33 and one PMOS transistor 34 are shown as a unit. Actually, though, a huge number of transistors and numerous capacitors exist on the substrate to form the memory array 11 and CMOS logic circuit block 2 shown in FIG. 1.

In the integrated circuit of this embodiment, the gate oxide film of the NMOS and PMOS transistors 33 and 34 for the CMOS logic circuit and the planar silicon dioxide film of the capacitor 32 may be made of a thermal oxide film of silicon with a substantially uniform thickness. Then, these films can be formed in a single process step. The capacitor 32 preferably operates in enhancement mode so that the capacitance thereof changes with the voltage applied thereto.

Alternatively, the insulating film of the capacitor 32 may also be made of any other insulator with a dielectric constant higher than that of silicon dioxide, e.g., silicon nitride, $Ta_3O_5$ or BST. Then, the capacitor 32 can have a greater capacitance per unit area. Accordingly, just by slightly modifying a standard CMOS process, each memory cell can have its area reduced and the fabrication cost can be cut down. As another alternative, the capacitor 32 may also be a depletion mode device.

FIG. 5 is a block diagram illustrating how power supply circuits may be connected for the semiconductor integrated circuit shown in FIG. 1. As shown in FIG. 5, the integrated circuit 1 includes first, second and third power supply circuits 51, 52 and 53 on the substrate thereof. In the illustrated embodiment, these three power supply circuits are used. Alternatively, the first, second and third power supply circuits 51, 52 and 53 may be combined in any other arbitrary combination.

The ground voltage VSS is input to the integrated circuit 1 by way of a ground voltage input terminal INVSS. The external supply voltage VPP is externally applied through an external supply voltage input terminal INVPP to the first and second power supply circuits 51 and 52 inside the integrated circuit 1.

The first power supply circuit 51 steps down the external supply voltage VPP to generate the first internal supply voltage VDD and outputs the voltage VDD to the second and third power supply circuits 52 and 53. The first power supply circuit 51 also outputs the first internal supply voltage VDD to an external unit through a first internal supply voltage monitoring terminal OUTVDD.

The second power supply circuit 52 steps down the external supply voltage VPP to generate second and third internal supply voltages VINT and VINTW, each of which is higher than the first internal supply voltage VDD by a predetermined difference. The third internal supply voltage VINTW is another exemplary secondary internal supply voltage as defined in the claims. The second power supply circuit 52 outputs the second internal supply voltage VINT as a bias voltage to the first n-well 42 for the DRAM block 10 and the third internal supply voltage VINTW as a high-level (non-selected-state) word line voltage to the word line driver 23, respectively.

The third power supply circuit 53 further steps down the first internal supply voltage VDD to generate a data line precharge voltage (which is another exemplary secondary internal supply voltage) VBP, and then applies the voltage VBP to the data line precharge circuit. The third power supply circuit 53 also outputs the data line precharge voltage VBP to an external unit through a data line precharge voltage monitoring terminal OUTVBP.

The peripheral circuits 150 of the memory array 21 in the DRAM are supplied with the first internal supply voltage VDD. As used herein, the "peripheral circuits" include: row decoder, column switch circuit and column decoder for controlling read and write operations on the DRAM; amplifier circuits such as sense and main amplifiers for amplifying read and write data; and internal timing generator.

The first internal supply voltage VDD is used as a reference voltage for the DRAM's operation. As described above, the first internal supply voltage VDD is generated by getting the external supply voltage VPP stepped down by a regulator. This is a very stable voltage because the first internal supply voltage VDD is not affected by any variation in the external supply voltage VPP. Although not shown, the output of the first power supply circuit 51 may be connected to an external capacitor with a large capacitance to further stabilize the first internal supply voltage VDD.

The second and third internal supply voltages VINT and VINTW and the data line precharge voltage VBP, which are all generated by reference to the constant, first internal supply voltage VDD, can also be very stable voltages without being affected by any variation in the external supply voltage VPP. Accordingly, the DRAM can operate stably enough.

Each of the first, second and third power supply circuits 51, 52 and 53 includes a circuit for generating a reference voltage as a target of its output voltage. The reference voltage generator includes a voltage-programming fuse. By trimming the fuse, the reference voltage is regulable in such a manner as to finely control the first, second or third internal supply voltage VDD, VINT or VINTW or the data line precharge voltage VBP. Accordingly, while the semiconductor integrated circuit 1 is being tested after having gone through the fabrication process thereof, the supply voltages for use in the DRAM are regulable. Consequently, the supply voltages can be set accurately enough without being affected by process-related variations.

For example, by trimming the fuse for the second power supply circuit 52, the third internal supply voltage VINTW is finely regulable in accordance with the amplitude of the threshold voltage of the memory access transistors 31. Then, the word line voltage is controllable in such a manner as to optimize the charge retainability of the capacitors 32.

In the illustrated embodiment, the second and third internal supply voltages VINT and VINTW are generated by the second power supply circuit 52. Alternatively, these voltages VINT and VINTW may also be generated by two mutually different power supply circuits. Also, the second and third internal supply voltages VINT and VINTW may be equal to each other. So in the following description, the second and third internal supply voltages VINT and VINTW are supposed to be equal to each other.

Figure 6A:
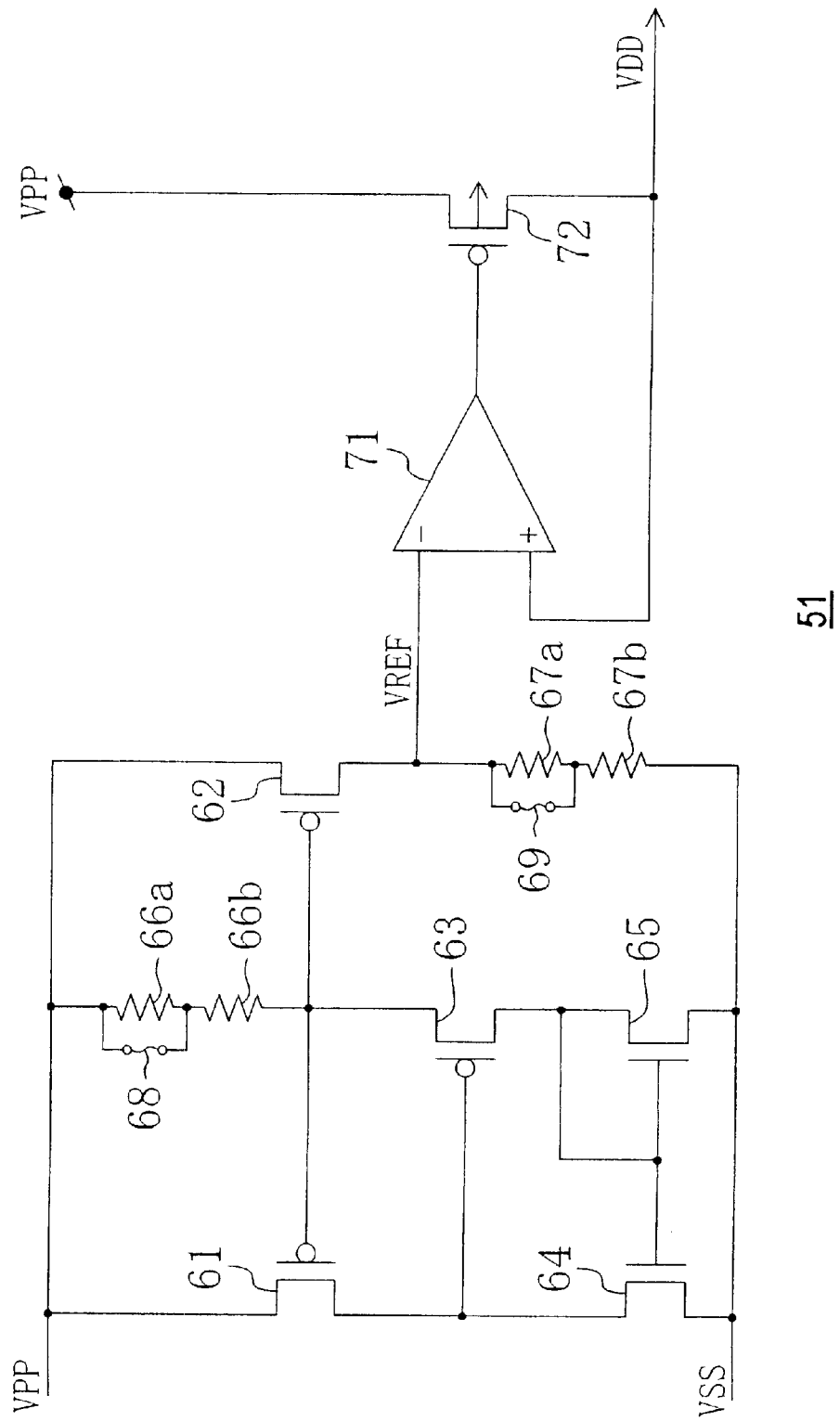
FIGS. 6(a), 6(b) and 6(c) are circuit diagrams illustrating a configuration for the first, second and third power supply circuit, respectively, shown in FIG. 5.

FIG. 6(a) is a circuit diagram illustrating a configuration for the first power supply circuit 51. As shown in FIG. 6(a), the first power supply circuit 51 includes PMOS transistors 61, 62, 63 and 72, NMOS transistors 64 and 65, resistors 66a, 66b, 67a, and 67b, fuses 68 and 69 and differential amplifier 71.

The external supply voltage VPP is applied to the source of the PMOS transistors 61 and 62. The PMOS transistor 61 has its drain connected to the gate of the PMOS transistor 63 and to the drain of the NMOS transistor 64. The ground voltage VSS is applied to the source of the NMOS transistors 64 and 65. The PMOS transistor 63 has its drain connected to the drain of. the NMOS transistor 65 and to the gate of the NMOS transistors 64 and 65.

The resistors 66a and 66b are connected in series together. This serial circuit has one of its two terminals supplied with the external supply voltage VPP and has the other terminal thereof connected to the gate of the PMOS transistors 61 and 62 and to the source of the PMOS transistor 63. The fuse 68 is connected in parallel with the resistor 66a.

The resistors 67a and 67b are connected in series together. This serial circuit has one of its two terminals supplied with the ground voltage VSS and has the other terminal thereof connected to the drain of the PMOS transistor 62. The fuse 69 is connected in parallel with the resistor 67a.

The drain voltage of the PMOS transistor 62 is the reference voltage VREF. The circuit made up of these components 61, 62, 63, 64, 65, 66a, 66b, 67a, 67b, 68 and 69 operates as a reference voltage generator.

The reference voltage VREF is input to the inverting input terminal of the differential amplifier 71. The output terminal of the differential amplifier 71 is connected to the gate of the PMOS transistor 72. The PMOS transistor 72 has its source supplied with the external supply voltage VPP and its drain connected to the non-inverting input terminal of the differential amplifier 71. The first internal supply voltage VDD is provided as the output of the first power supply circuit 51 from the drain of the PMOS transistor 72. That is to say, the PMOS transistor 72 is interposed between an external supply voltage terminal receiving the external supply voltage VPP and the output terminal. The first internal supply voltage VDD is controlled with the reference voltage VREF used as its target value.

The PMOS transistors 61, 62 and 63 are all of a size and have the same characteristic. The NMOS-transistors 64 and 65 are also of the same size and have the same characteristic.

The PMOS and NMOS transistors 61, 63, 64 and 65 together makes a current mirror circuit. Also, the gate-source voltage of the PMOS transistor 61 is equal to that of the PMOS transistor 62. Accordingly, the same amount of current I flows through each of these transistors 61 through 65. In this case, the following relationship is met:

$$IR1 = V_{gs} = V_{thp} + (2I/\beta)^{1/2} \tag{1}$$

where R1 is the resistance of the serial circuit made up of the resistors 66a and 66b, $V_{gs}$ is the gate-source voltage of the PMOS transistors 61 and 62, $V_{thp}$ is their threshold voltage and $\beta$ is their gain coefficient given by $$\beta = \mu C_{ox} W/L \tag{2}$$

where g is the-surface carrier mobility of the PMOS transistors 61 and 62, $C_{ox}$ is their gate capacitance per unit area, W is their channel width and L is their channel length.

In Equation (1), $(2I/\beta)^{1/2}$ can be set smaller than $V_{thp}$. Accordingly, the reference voltage VREF is given by $$VREF = IR2 = (R2/R1)V_{thp} \tag{3}$$

where R2 is the resistance of the serial circuit made up of the resistors 67a and 67b. Accordingly, the reference voltage VREF does not depend on the external supply voltage VPP. The resistance values R1 and R2 are regulated in such a manner as to set the reference voltage VREF at a predetermined target value for the first internal supply voltage VDD.

The differential amplifier 71 quickly performs a feedback control to equalize the first internal supply voltage VDD, i.e., the voltage received at its non-inverting input terminal, with the reference voltage VREF. Thus, the first internal supply voltage VDD can be kept constant without depending on the external supply voltage VPP.

The first internal supply voltage VDD is regulable by trimming the fuse 68 or 69. For example, if the fuse 68 is cut off, then the serial connection of the resistors 66a and 66b increases its resistance value R1 and the reference voltage VREF decreases as can be seen from Equation (3). As a result, the first internal supply voltage VDD falls. On the other hand, if the fuse 69 is cut off, then the serial connection of the resistors 67a and 67b increases its resistance value R2 and the reference voltage VREF increases as can be seen from Equation (3). As a result, the first internal supply voltage VDD rises.

In this manner, the first power supply circuit 51 can regulate the first internal supply voltage VDD by trimming one of its fuses 68 and 69 while the integrated circuit 1 is being tested after having gone through the fabrication process thereof. Thus, the first power supply circuit 51 can output a constant voltage without being affected by any process-related variation.

It would be obvious to those skilled in the art that the first power supply circuit 51 is modifiable in various manners. For example, the PMOS transistor 72 may be replaced with an NMOS transistor that receives a voltage of the opposite polarity at its gate.

Figure 6B:
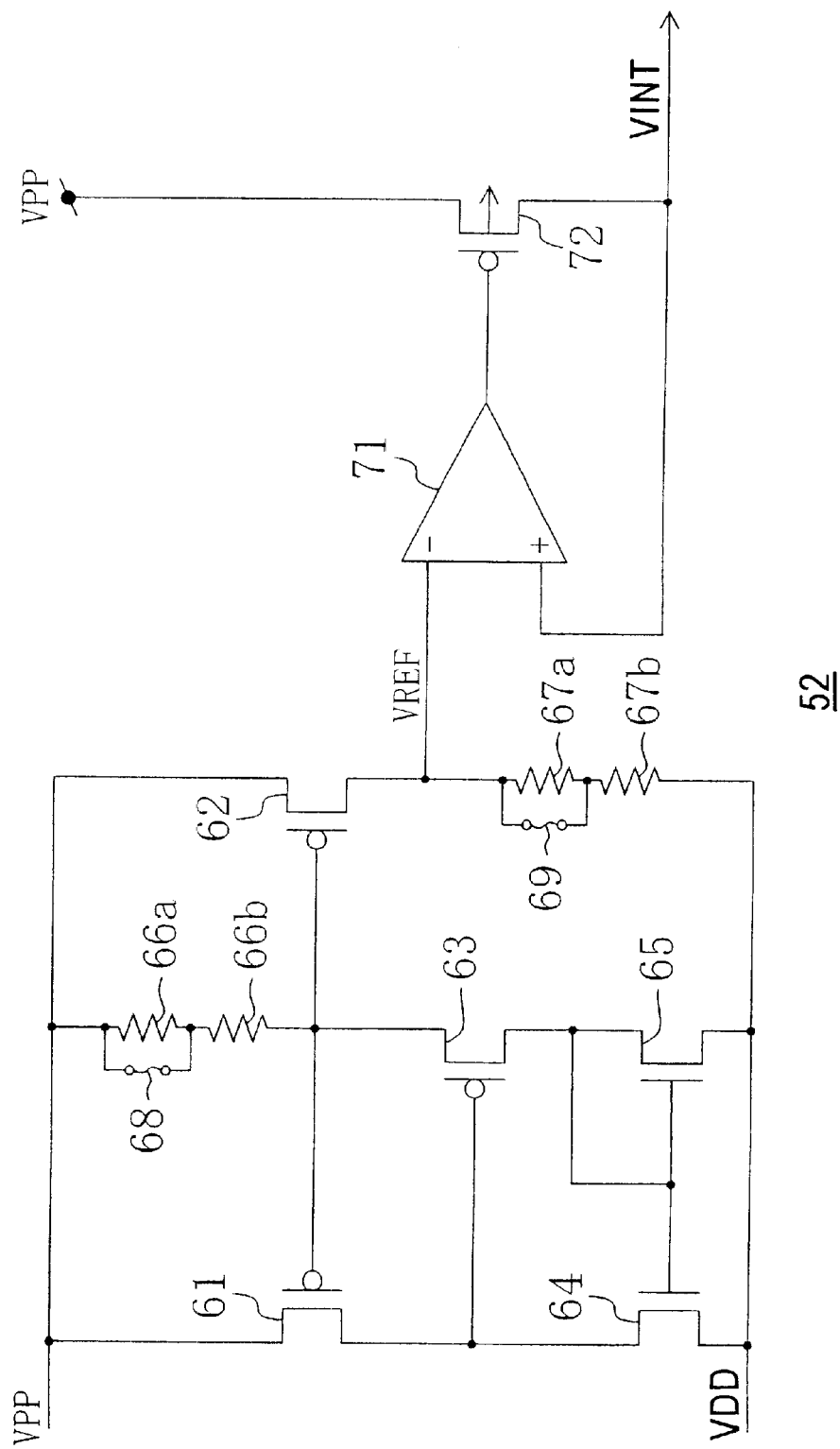

The second power supply circuit 52, as shown in FIG. 6(b), has the same configuration as the first power supply circuit 51 shown in FIG. 6(a). However, the second power supply circuit 52 receives the first internal supply voltage VDD instead of the ground voltage VSS and outputs the second internal supply voltage VINT, not the first internal supply voltage VDD. That is to say, the second power supply circuit 52 uses a voltage, which is higher than the first internal supply voltage VDD by a predetermined difference, as its reference voltage VREF. In the other respects, the second power supply circuit 52 has the same configuration as the first power supply circuit 51, and the description thereof will be omitted herein.

When the second power supply circuit 52 should output the third internal supply voltage VINTW, which is different from the second internal supply voltage VINT, the circuit 52 further includes another circuit with the same configuration as that illustrated in FIG. 6(a). And in the additional circuit, a voltage, which is higher than the first internal supply voltage VDD by another predetermined difference, is set as its reference voltage.

Figure 6C:
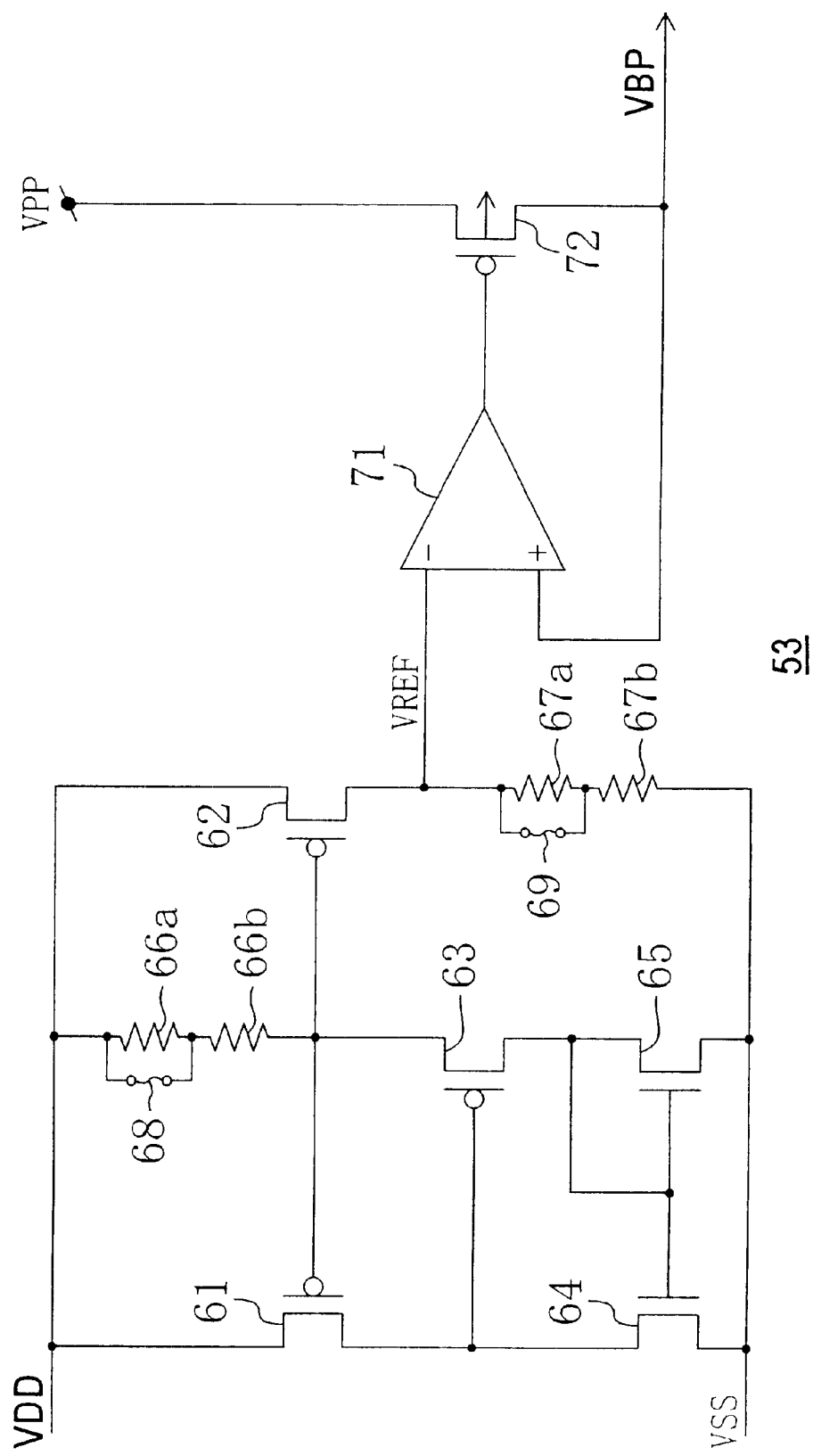

The third power supply circuit 53, as shown in FIG. 6(c), has the same configuration as the first power supply circuit 51 shown in FIG. 6(a). However, the third power supply circuit 53 receives the first internal supply voltage VDD instead of the external supply voltage VPP and outputs the data line precharge voltage VBP, not the first internal supply voltage VDD. Specifically, the third power supply circuit 53 uses a voltage, which is approximately equal to an average of the absolute value of the threshold voltage of the memory access transistors 31 and the first internal supply voltage VDD, as its reference voltage VREF. In the other respects, the third power supply circuit 53 has the same configuration as the first power supply circuit 51, and the description thereof will be omitted herein.

If the first internal supply voltage VDD has varied, the data line precharge voltage VBP should preferably change proportionally to the variation. Accordingly, although not shown, a serial connection of resistors may be additionally provided so as to have one of its terminals supplied with the first internal supply voltage VDD and the other terminal thereof supplied with the ground voltage VSS. In that case, a voltage at an intermediate node of this serial connection may be used as the reference voltage VREF.

Figure 7:
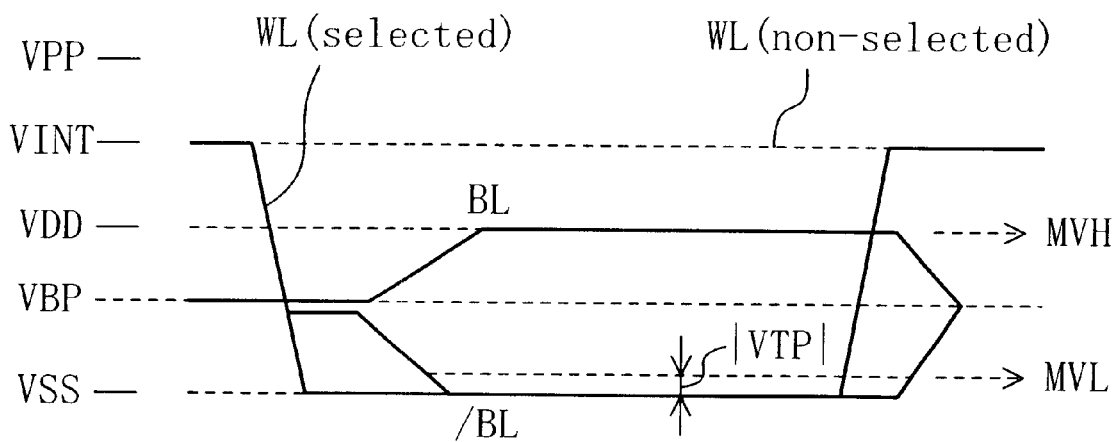
FIG. 7 is a timing diagram illustrating how respective voltages change while the DRAM block is operating.
Figure 8:
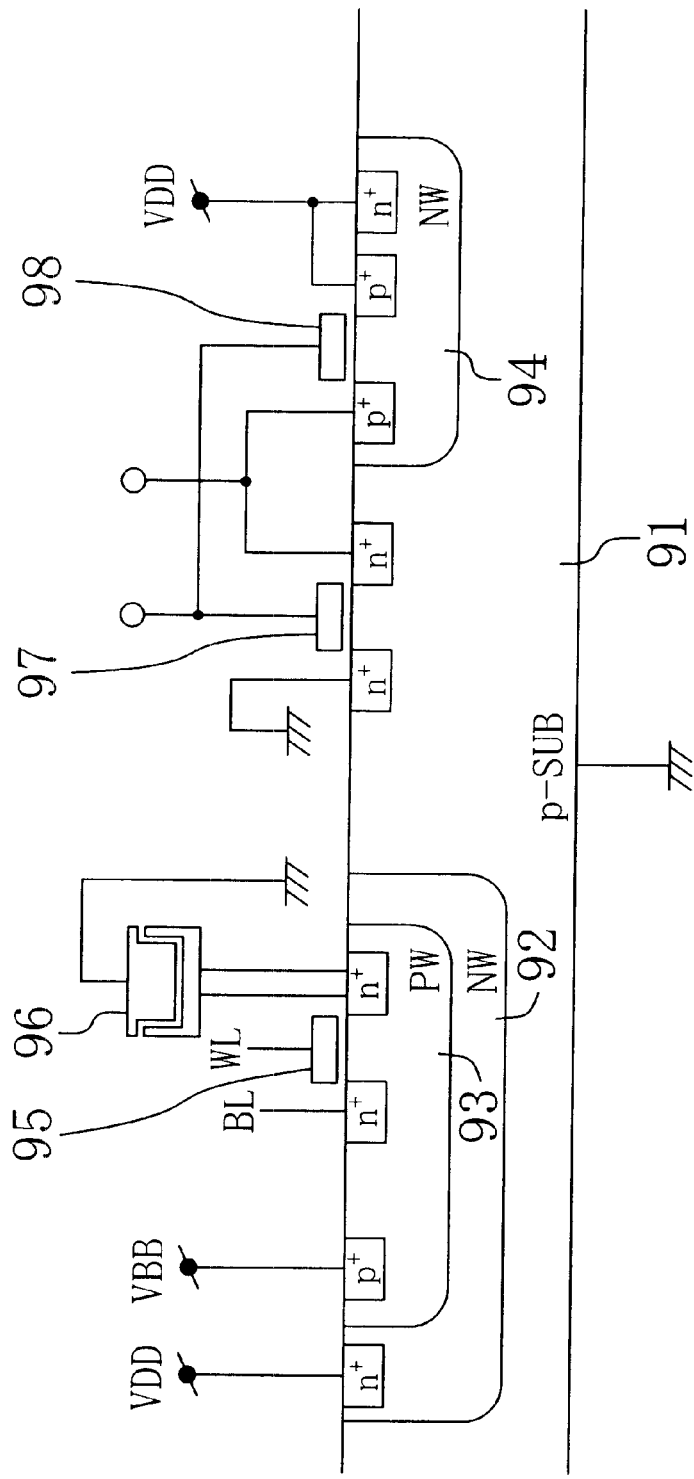
FIG. 8 is a cross-sectional view schematically illustrating a structure for a known stacked capacitor DRAM-built-in LSI.

FIG. 7 is a timing diagram illustrating how the respective voltages change while the DRAM block 10 is operating. The third internal supply voltage VINTW (which is supposed to be equal to the second internal supply voltage VINT in the example illustrated in FIG. 7) is being applied from the second power supply circuit 52 to the word line driver 23. While a word line WL is non-selected (i.e., while no read operation is being performed on any of the memory cells connected to the word line WL), the word line driver 23 applies the third internal supply voltage VINTW, which is higher than the first internal supply voltage VDD by a voltage difference V α, to the word line WL. In this manner, it is possible to prevent the charges stored on the capacitors of the memory cells from leaking into the data lines through the memory access transistors. The voltage difference V α is set at such a value as to minimize the sum of the sub-threshold current and junction current of the memory access transistors.

While no charges are stored on the capacitor of each memory cell (i.e., while the information stored thereon is in logical zero state), then the voltage applied to the capacitor is kept at a relatively low level MVL, which is approximately equal to the absolute value |VTP| of the threshold voltage VTP. On the other hand, while charges are stored on the capacitor (i.e., while the information stored thereon is in logical one state), then the voltage applied to the capacitor is kept at a relatively high level MVH, which is approximately equal to the first internal supply voltage VDD.

The data line precharge circuit precharges the data line pairs at the data line precharge voltage VBP, which is an intermediate voltage between the first internal supply voltage VDD and the absolute value of the threshold voltage VBP. That is to say, VBP=(VDD+|VPP|)/2. In other words, the data line pairs are precharged to a voltage, which is approximately equal to the average of the voltage at each memory cell capacitor on which no charges are stored and the voltage at the capacitor on which charges are stored.

Hereinafter, it will be described with reference to FIGS. 2 and 7 how to perform a read operation on the DRAM. The row decoder 22 decodes an input row address signal to generate a word line select signal, which is input to the word line driver 23. In response, the word line driver 23 activates a selected word line WL and decreases the voltage on the line WL from the third internal supply voltage VINTW to the ground voltage VSS, thereby turning ON the memory access transistors connected to the selected word line WL. As a result, the information stored on the capacitors of those memory cells is read out onto the folded data line pairs.

Each folded data line pair includes two data lines BL and/BL. If one data line/BL for use to read out data from the associated memory cell is connected to a capacitor on which charges are stored, then the voltage on the data line/BL is slightly higher than the data line precharge voltage VBP. On the other hand, if the data line/BL is connected to a capacitor on which no charges are stored, then the voltage on the data line/BL is slightly lower than the data line precharge voltage VBP. In this case, the voltage on the other data line BL is kept at the data line precharge voltage VBP.

The data line pairs are connected to the cross-coupled differential amplifiers included in the sense amplifier row 25. Thus, in accordance with that slight voltage difference caused between each data line pair during addressing, the higher voltage on one of the data lines rises toward the first internal supply voltage VDD while the lower voltage on the other data line falls toward the ground voltage VSS. In this case, the variations in data line voltages correspond to a positive feedback operation, so the voltages change quickly. Eventually, the higher voltage on one of the two data lines will reach and settle at the first internal supply voltage VDD as a high-level voltage, while the lower voltage on the other data line will reach and settle at the ground voltage VSS as a low-level voltage.

Thereafter, the column decoder 24 decodes a column address signal to generate a column select signal. In response, one of the sense amplifiers and one of the data lines are selected. The logical information stored on the memory cell is amplified by the sense amplifier and then output from the DRAM by way of the read/write amplifier 26.

As described above, according to the present invention, PMOS transistors are used as the memory access transistors. Thus, a CMOS logic circuit and a DRAM can be formed on the same semiconductor substrate without using the complicated triple well structure.

Also, the gate oxide film. of transistors for the CMOS logic circuit and the capacitive insulating film of capacitors for the DRAM may be made of a thermal oxide film of silicon with a uniform thickness. Then, the gate oxide and capacitive insulating films can be formed in a single process step. Accordingly, the transistors of the CMOS logic circuit and the DRAM can be formed on the same semiconductor substrate by a standard CMOS process, thus cutting down the fabrication cost. In addition, even during the fabrication process of the DRAM, the transistors of the CMOS logic circuit do not have their performance degraded.

Furthermore, the voltage applied to the DRAM is determined by reference to a constant voltage obtained by stepping down the external supply voltage. Thus, the DRAM can always be supplied with a constant voltage even if the external supply voltage is variable. Moreover, the supply voltage is finely adjustable by trimming a fuse while the DRAM is being tested. Then, a constant voltage can be applied to the DRAM without being affected by any process-related variation.

Although not shown, the memory array may be formed over an n-well included in a p-well that has been defined in an n-type semiconductor substrate. That is to say, the present invention is applicable to any structure in which an n-well exists in a p-type semiconductor region.

As described above, the present invention can stabilize the voltage supplied to the DRAM without being affected by any variation in external supply voltage or process-related variation. As a result, the DRAM can operate much more constantly with a great operation margin allowed. In addition, the DRAM can be designed much more flexibly and can be afforded a broader process margin. Then, the DRAM is easily testable, too.

Furthermore, the DRAM-built-in LSI of the present invention can be fabricated by a greatly simplified process. As a result, the fabrication cost can be cut down and yet the performance of transistors for the CMOS logic circuit does not deteriorate.

Thus, compared to any known integrated circuit having an SRAM or a DRAM with a three-dimensional capacitor structure, the DRAM-built-in semiconductor integrated circuit of the present invention can be fabricated at a lower cost without sacrificing the performance of the logic circuit thereof. Also, the DRAM built in the integrated circuit of the present invention works in various applications requiring medium-capacity memories.

What is claimed is:

1. A semiconductor integrated circuit comprising:
   a first n-well defined in a p-type semiconductor region;
   a plurality of word lines;
   a plurality of data lines;
   a dynamic random-access memory array in which multiple memory cells are arranged in matrix over the first n-well, each said memory cell including a p-channel metal-oxide semiconductor (MOS) access transistor and a capacitor, the access transistor having its gate connected to an associated one of the word lines, its source connected to an associated one of the data lines and its drain connected to the capacitor;
   a row of sense amplifiers coupled to the data lines;
   a word line driver for driving the word lines; and
   a power supply circuit, which receives an external supply voltage, generates internal supply voltages by stepping down the external supply voltage and then applies the internal supply voltages to the sense amplifiers, the word line driver and the first n-well.

2. The integrated circuit of claim 1, further comprising a logic circuit that has been formed in the p-type semiconductor region.

3. The integrated circuit of claim 1, wherein the power supply circuit steps down the external supply voltage to generate primary and secondary internal supply voltages as the internal supply voltages, the primary internal supply voltage being lower than the external supply voltage, the secondary internal supply voltage being lower than the external supply voltage but higher than the primary internal supply voltage, and wherein the primary internal supply voltage is applied to the sense amplifiers, while the first n-well is biased to the secondary internal supply voltage.

4. The integrated circuit of claim 3, further comprising a second n-well defined in the p-type semiconductor region and a logic circuit, which includes: an n-channel MOS transistor formed in the p-type semiconductor region; and a p-channel MOS transistor formed in the second n-well, wherein the power supply circuit biases the second n-well to the primary internal supply voltage.

5. The integrated circuit of claim 4, wherein the capacitor of each said memory cell comprises: a planar insulating film formed over the first n-well; and a planar upper electrode formed over the planar insulating film and biased to a ground voltage.

6. The integrated circuit of claim 5, wherein the planar insulating film is a silicon dioxide film that is almost as thick as the gate oxide film of the n- and p-channel MOS transistors.

7. The integrated circuit of claim 3, wherein the power supply circuit comprises:

a first MOS transistor interposed between an external supply voltage terminal and a first output terminal, the external supply voltage being applied through the external supply voltage terminal; and a first differential amplifier receiving a first reference voltage and a voltage at the first output terminal, and wherein the power supply circuit controls the first MOS transistor by the output of the first differential amplifier, and wherein the power supply circuit sets the primary internal supply voltage at a substantially constant voltage in accordance with the first reference voltage and outputs the primary internal supply voltage through the first output terminal.

8. The integrated circuit of claim 7, wherein the power supply circuit further comprises a first reference voltage generator for generating the first reference voltage, and wherein the first reference voltage generator includes a first fuse and regulates the first reference voltage by trimming the first fuse.

9. The integrated circuit of claim 7, wherein the power supply circuit further comprises:

a second MOS transistor interposed between the external supply voltage terminal and a second output terminal; and a second differential amplifier receiving a second reference voltage and a voltage at the second output terminal, and wherein the power supply circuit controls the second MOS transistor by the output of the second differential amplifier, and wherein the power supply circuit sets the secondary internal supply voltage at a substantially constant voltage corresponding to the second reference voltage and outputs the secondary internal supply voltage through the second output terminal.

10. The integrated circuit of claim 9, wherein the power supply circuit generates the second reference voltage based on the primary internal supply voltage.

11. The integrated circuit of claim 9, wherein the power supply circuit further comprises a second reference voltage generator for generating the second reference voltage, and wherein the second reference voltage generator includes a second fuse and regulates the second reference voltage by trimming the second fuse.

12. The integrated circuit of claim 1, wherein the power supply circuit steps down the external supply voltage to generate primary and secondary internal supply voltages as the internal supply voltages, the primary internal supply voltage being lower than the external supply voltage, the secondary internal supply voltage being lower than the external supply voltage but higher than the primary internal supply voltage, and wherein the primary internal supply voltage is applied to the sense amplifiers, while the secondary internal supply voltage is applied to the word line driver, and wherein the sense amplifiers apply the primary internal supply voltage as a high-level voltage to the data lines, and wherein the word line driver applies the secondary internal supply voltage as a non-selected-state voltage to the word lines.

13. The integrated circuit of claim 12, wherein the power supply circuit comprises:

a first MOS transistor interposed between an external supply voltage terminal and a first output terminal, the external supply voltage being applied through the external supply voltage terminal; and a first differential amplifier receiving a first reference voltage and a voltage at the first output terminal, and wherein the power supply circuit controls the first MOS transistor by the output of the first differential amplifier, and wherein the power supply circuit sets the primary internal supply voltage at a substantially constant voltage in accordance with the first reference voltage and outputs the primary internal supply voltage through the first output terminal.

14. The integrated circuit of claim 13, wherein the power supply circuit further comprises a first reference voltage generator for generating the first reference voltage, and wherein the first reference voltage generator includes a first fuse and regulates the first reference voltage by trimming the first fuse.

15. The integrated circuit of claim 13, wherein the power supply circuit further comprises:

a second MOS transistor interposed between the external supply voltage terminal and a second output terminal; and a second differential amplifier receiving a second reference voltage and a voltage at the second output terminal, and wherein the power supply circuit controls the second MOS transistor by the output of the second differential amplifier, and wherein the power supply circuit sets the secondary internal supply voltage at a substantially constant voltage corresponding to the second reference voltage and outputs the secondary internal supply voltage through the second output terminal.

16. The integrated circuit of claim 15, wherein the power supply circuit generates the second reference voltage based on the primary internal supply voltage.

17. The integrated circuit of claim 15, wherein the power supply circuit further comprises a second reference voltage generator for generating the second reference voltage, and wherein the second reference voltage generator includes a second fuse and regulates the second reference voltage by trimming the second fuse.

18. The integrated circuit of claim 1, wherein the power supply circuit steps down the external supply voltage to generate primary and secondary internal supply voltages, as the internal supply voltages, the primary internal supply voltage being lower than the external supply voltage, the secondary internal supply voltage being approximately equal to an average of the absolute value of a threshold voltage of the access transistor and the primary internal supply voltage, and wherein the data lines are supplied with the secondary internal supply voltage as a precharge voltage, and wherein the word lines are supplied with a ground voltage as a selected-state voltage.

19. The integrated circuit of claim 18, wherein a voltage representing the low level of the data lines is the ground voltage.

* * * * *